(12) United States Patent
Stafford et al.

(10) Patent No.: US 9,349,602 B2
(45) Date of Patent: May 24, 2016

(54) SEMICONDUCTOR WAFER CHUCK AND METHOD

(71) Applicant: JST Manufacturing Inc., Boise, ID (US)

(72) Inventors: Jacob Stafford, Meridian, ID (US); David Campion, Boise, ID (US); Travis Deleve, Boise, ID (US); Jason Boyd, Boise, ID (US)

(73) Assignee: JST MANUFACTURING, INC., Boise, ID (US)

( * ) Notice: Subject to any disclaimer, the term of this patent is extended or adjusted under 35 U.S.C. 154(b) by 0 days.

(21) Appl. No.: 14/261,281

(22) Filed: Apr. 24, 2014

(65) Prior Publication Data

US 2014/0322919 A1   Oct. 30, 2014

Related U.S. Application Data

(60) Provisional application No. 61/815,362, filed on Apr. 24, 2013.

(51) Int. Cl.

| | | |
|---|---|---|
| *H01L 23/34* | (2006.01) | |
| *H01L 21/288* | (2006.01) | |
| *H01L 21/67* | (2006.01) | |
| *H01L 21/687* | (2006.01) | |
| *G03F 7/16* | (2006.01) | |

(52) U.S. Cl.
CPC .............. *H01L 21/288* (2013.01); *G03F 7/162* (2013.01); *H01L 21/67051* (2013.01); *H01L 21/68728* (2013.01); *H01L 21/68792* (2013.01)

(58) Field of Classification Search
CPC ............ H01L 21/02068; H01L 21/02087; H01L 21/0209; H01L 21/288; H01L 21/31133; H01L 21/67028; H01L 21/67051; H01L 21/6708; H01L 21/6715
USPC .......... 257/631, 632, 718, 726, 727, E21.237
See application file for complete search history.

(56) References Cited

U.S. PATENT DOCUMENTS

| | | | | |
|---|---|---|---|---|
| 5,429,912 A | * | 7/1995 | Neoh .................... | G03F 7/3021 118/320 |
| 5,820,038 A | * | 10/1998 | Beltran ................... | G03F 7/162 239/750 |
| 2003/0118740 A1 | * | 6/2003 | Kitano .................... | G03F 7/162 430/271.1 |
| 2003/0148619 A1 | * | 8/2003 | Tsai ................... | H01L 21/28123 438/704 |
| 2003/0181042 A1 | * | 9/2003 | Chen ................. | H01L 21/67086 438/689 |
| 2007/0087582 A1 | * | 4/2007 | Carcasi ............... | H01L 21/0276 438/782 |

* cited by examiner

*Primary Examiner* — Mohammad Islam
*Assistant Examiner* — Joannie A Garcia
(74) *Attorney, Agent, or Firm* — Parsons Behle & Latimer

(57) ABSTRACT

A semiconductor wafer spinning chuck includes a rotatable base, a plurality of arms, upstanding from the base, a selectively releasable clamping mechanism, associated with the arms, and a spray nozzle, extending through the base. The clamping mechanism has a first portion configured to mechanically clamp an edge of a first semiconductor wafer and hold the first wafer in a substantially horizontal orientation upon all of the arms, with a backside of the first wafer facing down. The spray nozzle is oriented to direct a spray of fluid at the backside of the first wafer.

15 Claims, 4 Drawing Sheets

SEMICONDUCTOR WAFER CHUCK AND METHOD

PRIORITY CLAIM

The present application claims the benefit of U.S. Provisional Patent Application Ser. No. 61/815,362, entitled BACK SIDE RINSE WAFER CHUCK, filed on Apr. 24, 2013, the disclosure of which is incorporated herein by reference in its entirety.

BACKGROUND

1. Field of the Invention

The present disclosure generally relates to semiconductor fabrication and the chemical spraying, rinsing and drying of semiconductor wafers and substrates. More particularly, the present disclosure relates to a semiconductor wafer chuck that is particularly adapted for applying a chemical spray to the backside of the semiconductor wafer during chemical spraying and rinsing operations.

2. Related Art

During semiconductor wafer and substrate processing, wafers are often subjected to spinning processes to aid in chemical dispensing and coating. At various steps in these processes, wafers may be held or retained by wafer chucks of various configurations. Semiconductor wafers are typically secured to wafer chucks using a vacuum sealing mechanism. However, as chemicals—such as solvents and acids, among others—are used during a chemical spray process, the chemicals may come into contact with the backside of the wafer, which is undesirable.

Additionally, attaching and detaching a wafer from a wafer chuck may cause damage to the wafer. For instance, the wafer may not be centered properly on the wafer chuck and/or may not be removed properly from the wafer chuck, thus leading to potential wafer damage. In some cases, the architecture or form of the wafer chuck may cast shadows over portions of the wafer backside such that liquid cannot properly reach all areas of the wafer.

The present disclosure is intended to address at least one of the foregoing issues.

SUMMARY

It has been recognized that it would be advantageous to have a semiconductor wafer chuck that can aid in the process of centering and spinning a semiconductor wafer substrate.

It has also been recognized that it would be advantageous to have a semiconductor wafer chuck that can allow for easy cleaning and the use of a wide array of chemicals while the wafer is on the chuck.

In accordance with one embodiment thereof, the present invention provides a semiconductor wafer spinning chuck that includes a rotatable base, a plurality of arms, upstanding from the base, a selectively releasable clamping mechanism, associated the arms, and a spray nozzle, extending through the base. The clamping mechanism has a first portion configured to mechanically clamp an edge of a first semiconductor wafer and hold the first wafer in a substantially horizontal orientation upon all of the arms, with a backside of the first wafer facing down. The spray nozzle is oriented to direct a spray of chemical at the backside of the first wafer.

In accordance with another aspect thereof, the invention provides a semiconductor wafer spinning chuck, having a rotatable base, a plurality of supports, upstanding from the base, a mechanical clamping mechanism, and a backside spray mechanism, associated with the base. The plurality of supports are configured to support an edge of a semiconductor wafer at a first common elevation above the base with the wafer substantially horizontal and a backside of the wafer substantially completely exposed. The mechanical clamping mechanism is configured to selectively secure the semiconductor wafer upon the plurality of supports. The backside spray mechanism is configured to provide a chemical spray against the exposed backside of the wafer while the base is spinning the wafer at a selected rotational speed.

In accordance with yet another aspect thereof, the invention provides a method for spraying a backside of a semiconductor wafer. The method includes placing the wafer substantially horizontally in a releasable clamping mechanism of a chuck having a spray nozzle, spinning the chuck with the wafer secured therein, and applying to the backside of the wafer a spray of chemical from the spray nozzle. The chuck is rotatable about a vertical axis, and is configured to hold the wafer above the spray nozzle and with a backside of the wafer substantially completely exposed. The spray of chemical upon the backside of the wafer is applied while simultaneously spinning the chuck and applying a spray of chemical upon a top surface of the wafer.

BRIEF DESCRIPTION OF THE DRAWINGS

Additional features and advantages of the invention will be apparent from the detailed description which follows, taken in conjunction with the accompanying drawings, which together illustrate, by way of example, features of the invention, and wherein.

DETAILED DESCRIPTION

Figure 1:
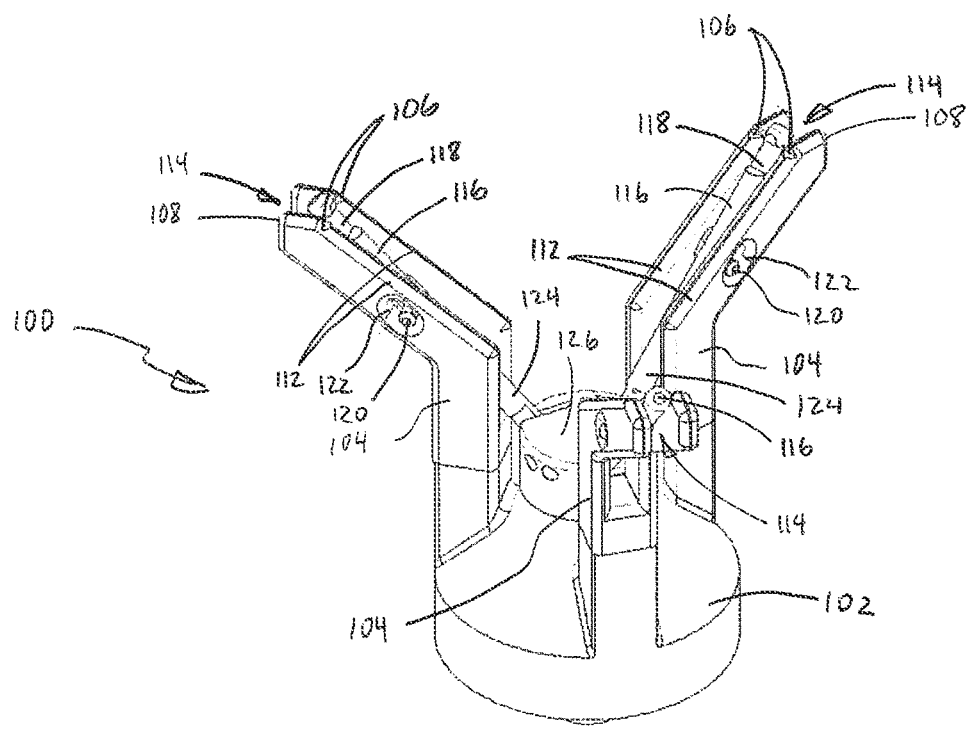
FIG. 1 is an isometric view of an embodiment of a semiconductor wafer chuck in accordance with the present disclosure.
Figure 2:
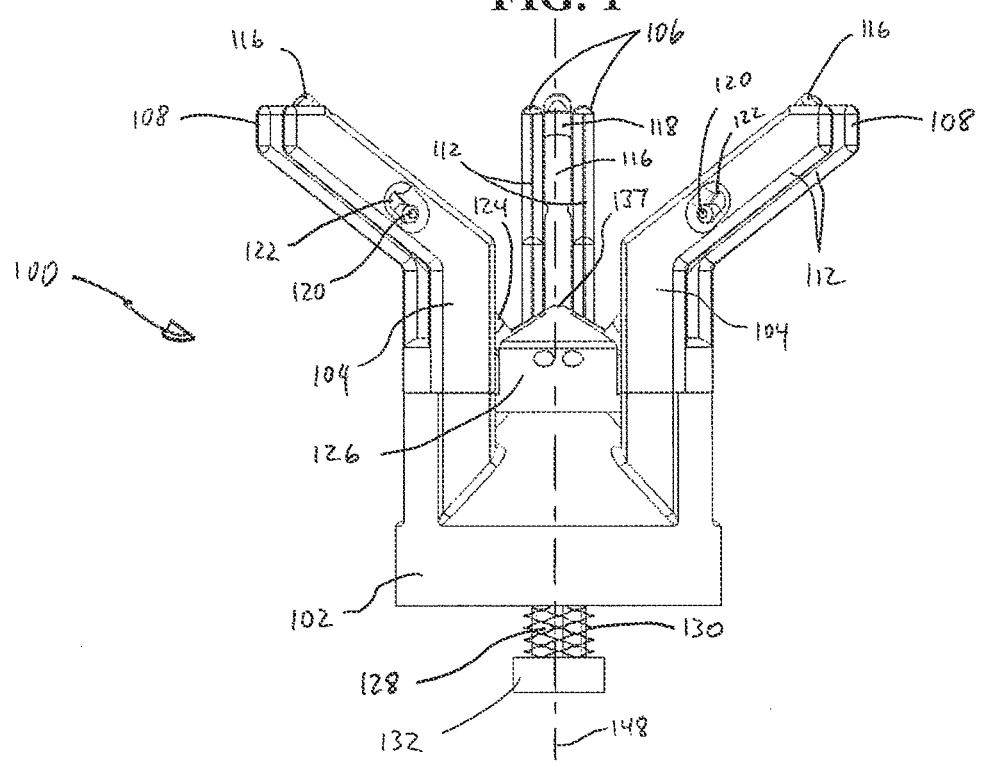
FIG. 2 is a front view of the semiconductor wafer chuck of FIG. 1.

In the following detailed description, reference will be made to the accompanying drawings that form a part hereof, and in which is shown by way of illustration specific embodiments in which the disclosure may be practiced. These embodiments are described in sufficient detail to enable those skilled in the art to practice the disclosure, and it is to be understood that other embodiments may be utilized and that various changes may be made without departing from the spirit and scope of the present disclosure. The following detailed description is, therefore, not to be taken in a limiting sense.

As noted above, semiconductor spinners typically use vacuum pressure to secure a substrate to them, or substrates are simply placed on a wafer chuck and held by other means, such as mechanical clamps and the like. Advantageously, the present disclosure provides a semiconductor wafer chuck that can aid in the process of centering and spinning the substrate during a chemical spray operation, and can mechanically center and hold the wafer in a desired position, exposing the backside of the wafer to facilitate an adequate spray. This semiconductor wafer chuck disclosed herein can be used in various ways in a variety of semiconductor fabrication operations. For example, this chuck can be used for both low volume and high volume semiconductor fabrication. In one application, it can be associated with automated tools in high volume chip production. Alternatively, this chuck is also suited to use in low volume operations, including the rinsing of semiconductor wafers that have high relief features, such as MEMs devices. Many other applications are also possible.

The configuration of the chuck disclosed herein aids in centering the substrate during this chemical spray phase, and also allows for easy cleaning and for the use of a wide array of chemicals while the substrate is on the chuck. The unobstructed back of the wafer also helps to minimize possible shadows or obstructions that might otherwise block chemical from reaching all parts of the backside of the wafer. The chuck also allows the application of chemical through a center spray, which enables a user to evenly apply chemical to the entire wafer.

Shown in FIGS. 1-4 are various views of an embodiment of a semiconductor wafer chuck 100 in accordance with the present disclosure. Viewing FIGS. 1 and 4, this wafer chuck 100 generally includes a base 102 with a plurality of arms 104 extending generally upward and outward from the base 102. The chuck 100 is mounted upon a motorized spindle 128, and is configured to rotate about a central axis of rotation 148, which passes through the center of the fastener chuck 100. The axis of rotation 148 is generally vertically oriented, such that a semiconductor substrate (110 in FIG. 4) that is held in the chuck lies in a generally horizontal plane when placed on the chuck 100. The substrate or wafer 110 is substantially circular, and the chuck 100 is configured to hold and center the substrate relative to the axis of rotation 148. While the embodiment shown in FIGS. 1-4 has three arms 104, it is to be understood that the number of arms can vary. For example, it is believed that three arms 104 is the minimum that can be used, but any greater number of arms can also be used. The radially-spaced arms 104 allow for a more exposed backside of the wafer substrate 110, shown in FIG. 4.

The arms 104 include a shelf or shoulder 106 near their distal ends 108. The shoulders 106 of all the arms 104 operate together to provide a platform that can support the semiconductor wafer 110 substantially horizontally at a set elevation above the base 102. In the embodiment of FIGS. 1-4 the substrate or wafer 110 is mechanically engaged with the radial arms 104 via clamp rods 116 that clamp onto the edges of the substrate 110. Each arm 104 includes two side pieces 112, which define a central hollow or space 114 therebetween. This space 114 is configured for passage of a moveable clamp rod 116. The clamp rods 116 each include a distal engagement slot 118 for receiving and holding the edge of the wafer substrate 110, and a pair of lateral extensions 120 which extend from both sides of the clamp rods and slidingly fit within a pair of engagement slots 122 in the adjacent side pieces 112 of the arms 104. The engagement slots 118 are angled so that they operate to center the wafer 110 in the chuck 100 as they engage it.

The proximal end 124 of each clamp rod 116 is pivotally attached to a vertically moveable center hub 126 at a pivotal connection point 144 (shown in FIG. 3), and the hub 102 in turn is moveably attached to the base 102, and configured to move vertically relative to the base 102 to actuate the clamp rods 116. The pivotal connection point 144 for each clamp rod 116 can be fitted with shims (not shown) to allow for adjustment of the location of contact of the engagement arms 116 upon the wafer 110. When the center hub 126 is raised, as illustrated in dashed lines in FIG. 3, this pushes the proximal end 124 of each clamp rod 116 up, causing the lateral extensions 120 of the clamp rods to ride in the engagement slots 122 and thus cause the distal slots 118 of the clamp rods 116 to move outward and upward.

The engagement slots 122 can be of various configurations in order to affect the movement of the distal ends of the clamp rods 116 in a desired way. For example, as is most apparent in FIGS. 1 and 2, the engagement slots 122 in this embodiment have an arcuate shape, so that the distal ends of the clamp rods 116 move in a non-linear manner, such as, for example, moving upward and outward, away from the wafer 110 when the center hub moves up. This motion opens the clamp rods 116, allowing a semiconductor wafer 110 to be inserted into or released from the chuck 100.

Figure 4:
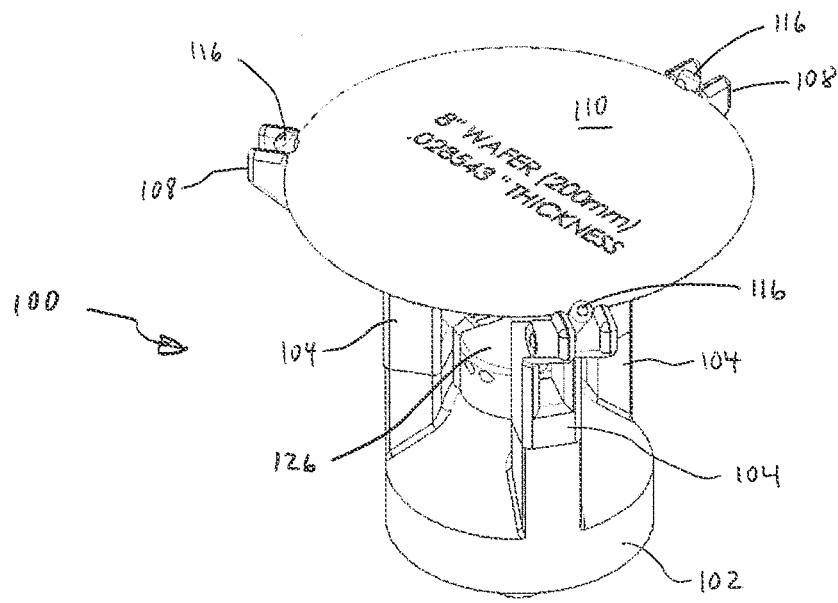
FIG. 4 is a perspective view of the semiconductor wafer chuck of FIG. 1 with a semiconductor wafer disposed therein.

When the center hub 126 is lowered, this pulls the proximal end 124 of each clamp rod 116 down, causing the lateral extensions 120 of the clamp rods to slide downward and inward in the engagement slots 122 and thus pull the distal slots 118 of the clamp rods 116 downward and inward. This motion closes the clamp rods 116 by causing the distal slots 118 to slide in against the edges of the wafer 110 and pull the wafer against the shoulders 106 of the arms 104. This both centers and holds the semiconductor wafer 110 in the chuck 100, as shown in FIG. 4.

Figure 7:
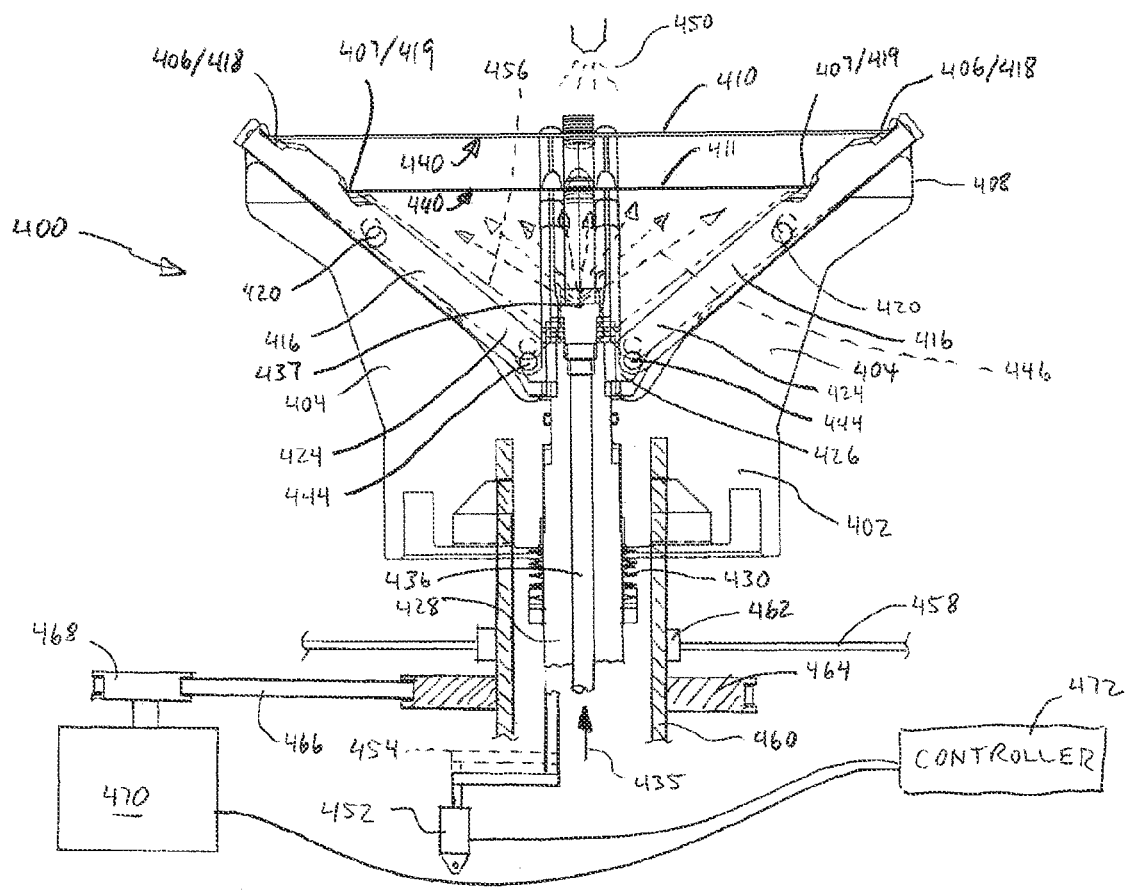
FIG. 7 is a front, cross-sectional view of the semiconductor wafer chuck of FIG. 4, showing the operation of the clamp rods and depicting the chemical spray.
Figure 8:
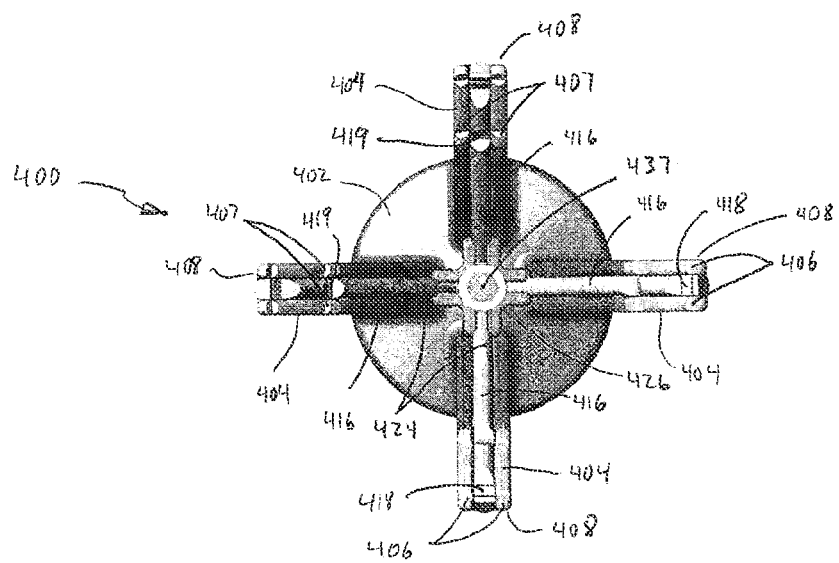
FIG. 8 is a top view of the semiconductor wafer chuck of FIG. 4.

The center hub 126 is mounted on a center shaft 128, which is biased toward the lowered position by a spring 130, which normally biases the clamp rods 116 down toward the closed or clamped position and holds the clamp rods 116 to the wafer 110. The bottom 132 of the center shaft 128 can be attached to a pneumatic cylinder (not shown), which, when extended, pushes upward on the center shaft 128 against the force of the spring 130, thus raising the center hub 126 and pushing the clamp rods up and out to the release position. In this way the center hub is operable to release the clamp rods 116 to release a wafer 110. Additional features for rotating the chuck 100 and allow selective raising and lower of the center hub 126 are not shown in FIGS. 1-4, but such features are shown in the embodiment of FIG. 7, described below, and can be applied to the embodiment of FIGS. 1-4.

Figure 3:
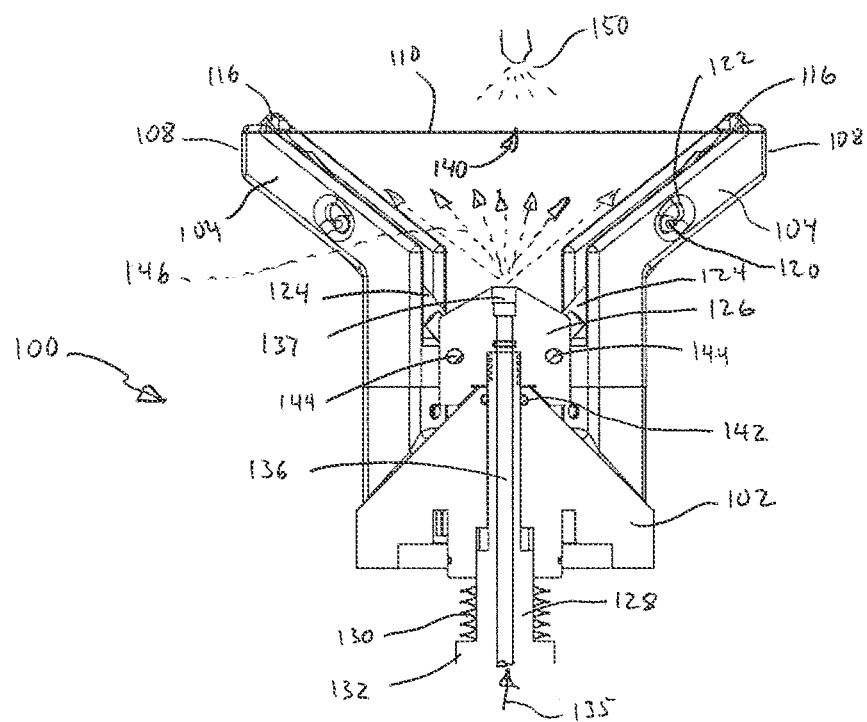
FIG. 3 is a front, cross-sectional view of the semiconductor wafer chuck of FIG. 1, showing operation of the clamp rods.

Referring specifically to FIG. 3, the spindle 128, to which the base 102 of the chuck 100 is affixed, has a hollow central passageway 136 that is in fluid communication with the nozzle 137. The central passageway 136 is adapted for receiving a flow of chemical, indicated by arrow 135, and the spray nozzle 137 allows for dispensing a chemical spray 146 against the underside or backside 140 of the wafer 110 as it spins. The backside chemical spray 146 can be any one of a wide variety of semiconductor processing chemicals, such as acids, solvents and rinsing chemicals such as deionized water and isopropyl alcohol (IPA). Other chemicals can also be used. In one exemplary embodiment, a spray of rinse chemical upon the backside of a wafer can be applied to protect the backside during spray application of a process chemical, such as a solvent or an acid, upon the top surface of the wafer. A dynamic rod seal or O-ring 142 can be provided around the center shaft 128 to constrain the flow of chemicals to a desired path or trajectory, such as through the central passageway 136. The O-ring seals the shaft 128 below the center hub 102 below the pivotal connection points 144 at the proximal ends 124 of the clamp rods 116.

In use, a wafer 110 will sit on the ledges 106 of the arms 104 of the chuck, while the clamp rods 116 mechanically hold the edges of the wafer 110 against the ledges 106. In this position, the chuck 100 is caused to spin at a selected speed, and a chemical spray, indicated at 150, can be applied to the top surface of the wafer 110, while the backside chemical spray 146 can be simultaneously applied from the nozzle 137 to the backside of the wafer 110. Spinning of the entire wafer chuck 100 helps allow even coverage of chemicals that are sprayed on the top and bottom of the substrate. Spinning operations of this sort typically have rotational speeds in the range of 400 to 1000 rpm. A rotational speed of about 500 rpm is common for spraying of chemicals, and a rotational speed of about 1000 rpm is common for drying.

The configuration of the chuck 100 allows contemporaneous spraying of both sides of the wafer 110 by allowing chemical to be dispensed from below the wafer 110 while it is also being sprayed from above. Simultaneous application of a top surface spray 150 and the backside spray 146 also helps to hold the semiconductor wafer 110 in the chuck. A chemical spray that is applied to the top surface of a semiconductor wafer 110 can be a relatively high pressure spray, such as around 1000 psi. On the other hand, the backside spray 146 is generally at significantly lower pressure, such as around 80 psi. The pressure differential between these two sprays, applied at the same time, thus provides a greater force upon the top of the wafer, thus helping to hold it in place in the chuck 100. Advantageously, the configuration of the chuck 100 helps to minimize shadows that could be cast upon the wafer 110, and which could hinder the effectiveness of the spraying process.

Another embodiment of a semiconductor wafer chuck is shown in FIGS. 5-8. This semiconductor wafer chuck 400 includes a base 402 with a plurality of arms 404 extending generally upward and outward from the base 402. The chuck 400 is configured to rotate about a central axis of rotation 448, which passes through the center of the chuck 400. The axis of rotation 448 is generally vertically oriented, such that a semiconductor substrate 410, 411 that is held in the chuck 400 lies in a generally horizontal plane when placed on the chuck 400. In this embodiment, the chuck includes four arms 404.

Advantageously, this chuck 400 is configured to selectively secure two different sizes of semiconductor wafers. The arms 404 include a first shelf or shoulder 406 near their distal ends 408. This shelf 406 is configured to support a first, larger size (e.g. 8 in. diameter) semiconductor wafer 410, shown in dashed lines in FIG. 5, at a first, higher elevation relative to the base 402. The arms 404 also include a second shelf or shoulder 407, located in a central portion 409 of the arms. This shelf 407 is configured to support a second, smaller size (e.g. 6 in. diameter) semiconductor wafer 411 at a second, lower elevation relative to the base 402. This configuration allows the single chuck 400 to be used with two different sizes of semiconductor wafers 410, 411, though only one substrate (i.e. one size or the other) is held in the arms and processed at any given time.

The substrate or wafer 410, 411 is mechanically engaged with the radial arms 404 via clamp rods 416 that clamp onto the edges of the substrate 410, 411. Each arm 404 includes a central hollow or space, which is configured for passage of a moveable clamp rod 416. The clamp rods 416 each include a first distal slot 418 for receiving and holding the edge of a large wafer substrate 410, and a second proximal slot 419 for receiving and holding the edge of a smaller wafer substrate 411. The distal slot 418 generally aligns with first shelf or shoulder 406, and the proximal slot 419 generally aligns with the second shelf or shoulder 407. The clamp rods 416 each also include a pair of lateral extensions 420 which extend from both sides of the clamp rods 416 and slidingly fit within a pair of engagement slots 422 in the adjacent sides of the arms 404.

The proximal end 424 of each clamp rod 416 is pivotally attached to a vertically moveable center hub 426 at a pivotal connection point 444, and the hub 426 in turn is moveably attached to the base 402, and configured to move vertically relative to the base 402 to actuate the clamp rods 416, in the manner discussed above with respect to the embodiment shown in FIGS. 1-4. The pivotal connection point 444 for each clamp rod 416 can be fitted with shims (not shown) to allow for adjustment of the location of contact of the engagement arms 416 upon the wafer 410. When the center hub 426 is raised, this pushes the proximal end 424 of each clamp rod 416 up, causing the lateral extensions 420 of the clamp rods to ride in the engagement slots 422 and thus cause the distal slots 418 of the clamp rods 416 to move upward and outward. The engagement slots 422 are configured like those shown and described above with respect to the embodiment of FIGS. 1-4.

Figure 5:
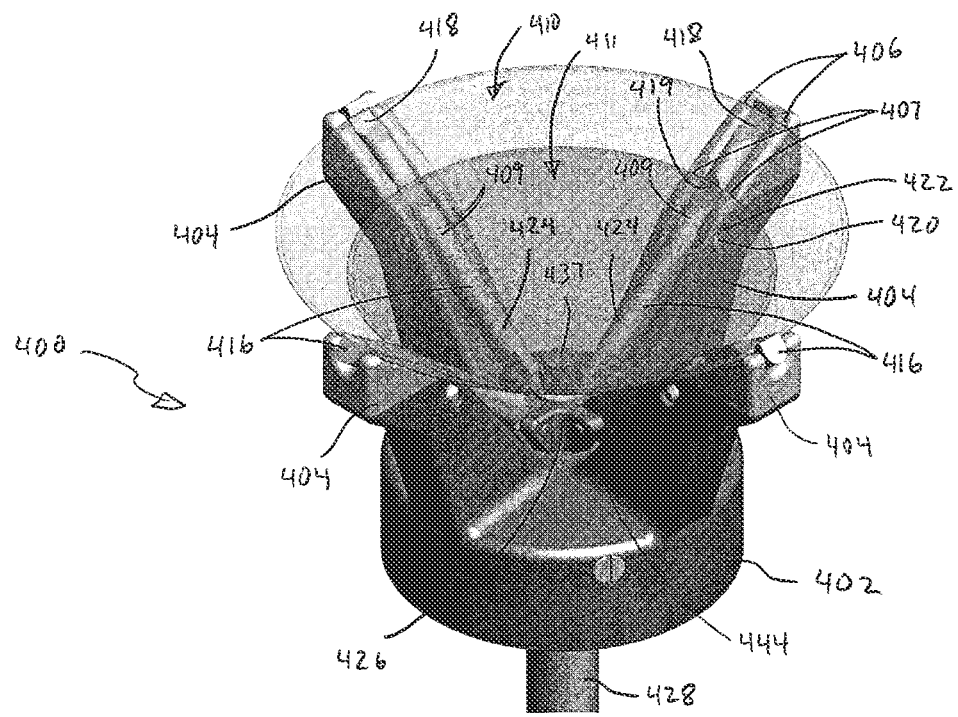
FIG. 5 is a perspective view of another embodiment of a semiconductor wafer chuck in accordance with the present disclosure.
Figure 6:
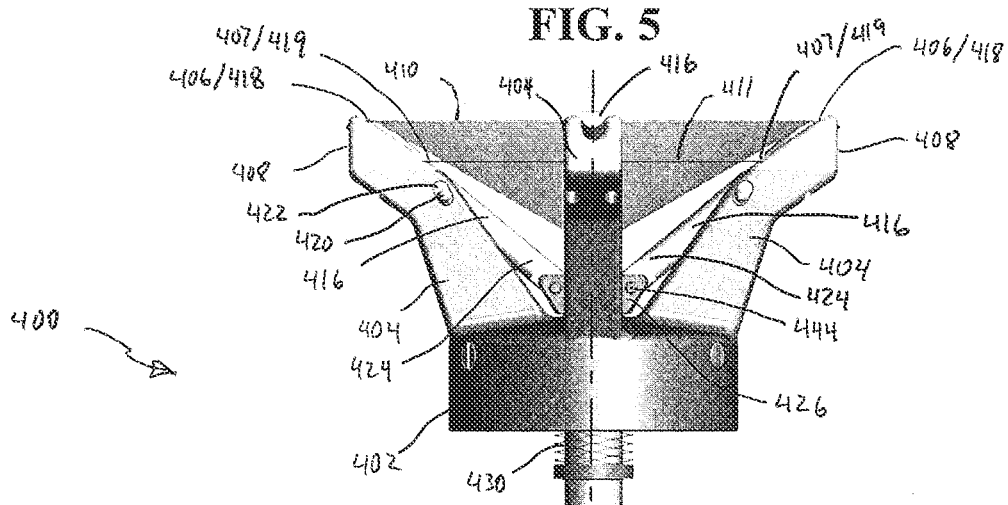
FIG. 6 is a front view of the semiconductor wafer chuck of FIG. 4.

With this configuration, the distal ends of the clamp rods 416 move in a non-linear manner, moving upward and outward when the center hub 426 moves up. This motion opens the clamp rods 416, allowing a semiconductor wafer 410, 411 to be inserted into or released from the chuck 400. Conversely, when the center hub 426 is lowered, this pulls the proximal end 424 of each clamp rod 416 down, causing the lateral extensions 420 of the clamp rods to slide downward and inward in the engagement slots 422 and thus pull the distal slots 418 and proximal slots 419 of the clamp rods 416 downward and inward. This motion closes the clamp rods 416 by causing the slots 418, 419 to slide in against the edges of the wafer 410 or 411, and pull the wafer against the shoulders 406 or 407 of the arms 404. This holds the semiconductor wafer 410, 411 in the chuck 400, as shown in FIGS. 5-7.

The center hub 426 is mounted on a center shaft 428, which is biased toward the lowered position by a spring 430, which therefore normally pulls the clamp rods 416 down toward the closed or clamped position and holds the clamp rods 416 to the wafer 410. As shown in the cross-sectional view of FIG. 7, the bottom of the center shaft 428 is attached to an actuator 452, such as a pneumatic cylinder, which, when moved to an extended position, indicated in dashed lines at 454, pushes upward on the center shaft 428 against the force of the spring 430, thus raising the center hub 426 and pushing the clamp rods 416 up and out to the release position. Various types of actuators 452 can be used for the shaft 428 and hub 426, such as pneumatic, hydraulic, electromechanical, etc. The raised position of the center hub 426 and the clamp rods 416 is shown in dashed lines at 456. In this way the pneumatic cylinder is operable to release the clamp rods 416 to release a wafer 410 or 411.

The center shaft 428 includes a central passageway 436 that is adapted for receiving a flow of chemical, indicated by arrow 435, and the spray nozzle 437 allows for dispensing of this chemical in a chemical spray 446 against the underside or backside 440 of the wafer 410 or 411 as it spins with the chuck 400. Apparatus, such as pumps, conduits, etc. for providing the chemical flow 435 to the central passageway 436 are not shown in FIG. 7, but suitable devices for providing this flow at a suitable pressure and flow rate can be selected by those of skill in the art. The fluid for the backside of the wafer 410 or 411 can be applied in a wide fan-shaped spray 446, so as to maximize coverage of the chemical spray. As can be seen in FIG. 7, the spray 446 can have a diverging fan shape so that it is suitable for both a larger wafer 410 disposed at a higher elevation relative to the chuck base 402, and also for a smaller wafer 411, since the smaller wafer 411 is held at a second lower elevation and is closer to the spray nozzle 437.

A dynamic rod seal or O-ring 442 can be provided around the center shaft 428 to constrain the flow of chemicals to a desired path or trajectory, such as through the central passageway 436. The O-ring seals the shaft 428 below the center hub 402 below the pivotal connection points 444 at the proximal ends 424 of the clamp rods 416.

Additional features for rotating the chuck 400 and allowing selective raising and lowering of the center hub 426 are also shown in FIG. 7, and these features can also be applied to the embodiment of FIGS. 1-4. The chuck 400 is configured to be disposed inside a processing chamber, the floor 458 of which is partially shown in FIG. 7. An extension shaft 460 extends downward from the base 402 of the chuck 400 and through a seal 462 in the floor 458 of the chamber. A chuck drive pulley 464 (shown in cross-section in FIG. 7) is attached to the extension shaft 460 below the floor 458 of the chamber, and is connected by a drive belt 466 to a drive pulley 468 of a motor 470. In this way the motor 470 can drive rotation of the chuck 400 by turning the extension shaft 460. While an electric motor and belt drive system are shown in FIG. 7, it is to be appreciated that other devices for driving rotation of the chuck 400 can also be used.

The motor 470 and the actuator 452 (for raising and lower the hub 426) are connected to a controller 472 that is configured to control operation of the system, allowing coordinated clamping and unclamping of substrates by the chuck 400, and spinning of the chuck and spraying of chemical upon the substrate 410 or 411. This controller 472 can be a microcomputer having a processor and system memory, and programmed with control software for controlling the motor 470, the actuator 452 and other devices associated with the entire system (e.g. pumps for pumping the chemical, open/close devices for the processing chamber, sensors, etc.). The controller 472 can be integrated into an automated system that operates multiple semiconductor processing devices and includes automated devices for handling the substrates and transporting them between the processing devices. It will also be appreciated, however, that control devices other than a computerized controller can be used.

In use, a wafer 410 or 411 will sit on the appropriate ledges 406, 407 of the arms 404 of the chuck 400, while the clamp rods 416 mechanically hold the edges of the wafer 410 or 411 against the respective ledges 406, 407. In this position a chemical spray 450 can be applied to the top surface of the wafer 410 or 411, while the backside chemical spray 446 is simultaneously applied to the backside 440 of the wafer from the nozzle 437.

In this position, the chuck 400 is caused to spin at a selected speed, and a chemical spray is applied to the top surface of the wafer 410 or 411, while a backside chemical spray can be simultaneously applied from the nozzle 437 to the backside of the wafer 410 or 411. As discussed above, the rotational speed can be in the range of 400 to 1000 rpm, with a speed of about 500 rpm being a likely speed for spraying of chemicals, and a rotational speed of about 1000 rpm is common for drying. The configuration of the chuck 400 thus allows contemporaneous spraying of both sides of the wafer 410 or 411 by allowing chemical to be dispensed from below the wafer 410, 411 while it is also being sprayed from above. As discussed above, simultaneous application of a top surface chemical spray, which can be at a pressure of around 1000 psi, and the backside spray, which is more likely at a pressure of around 80 psi, also helps to hold the semiconductor wafer 410, 411 in the chuck 400. Advantageously, the configuration of the chuck 400 also helps to minimize shadows that could be cast upon the wafer 110, and which could hinder the effectiveness of the spraying process.

As described herein, the disclosed semiconductor wafer chuck 100, 400 can be used for a variety of semiconductor fabrication processes. This chuck allows a user to spray a backside of a semiconductor wafer with a selected chemical spray, while simultaneously spraying a top surface of the same wafer with the same or a different chemical spray. In carrying out this process, the wafer is placed substantially horizontally in the releasable clamping mechanism of the chuck, with the wafer disposed above the spray nozzle of the chuck, and the backside of the wafer substantially completely exposed. In various embodiments disclosed herein, placing the wafer in the releasable clamping mechanism can involve placing the wafer upon support surfaces of upstanding arms of the chuck, and drawing a plurality of clamp arms against an edge of the wafer adjacent to the support surfaces, so as to press and hold the wafer against the support surfaces. In one embodiment, the wafer can be placed in the releasable clamping mechanism at one of multiple elevations above the spray nozzle of the chuck. The chuck can be configured such that the multiple elevations depend upon the diameter of the wafer.

The chuck is then spun about its vertical axis with the wafer secured therein, and, while spinning, a spray of chemical from the spray nozzle is applied to the backside of the wafer while a spray of chemical is simultaneously applied upon a top surface of the wafer. The spray of chemical to the backside of the wafer can be at a first lower pressure, while the spray of chemical upon the top surface of the wafer is at a second higher pressure.

As discussed above, the chuck can be spun at a variety of speeds, such as in the range of from about 400 rpm to about 1000 rpm. Other speeds can also be used.

The present disclosure thus provides a method and apparatus for spraying the back of semiconductor substrates while spinning It discloses a wafer chuck with radially mounted arms that mechanically engage the substrate of a wafer resting in the center of the chuck and elevated by positioning features. The wafer is further held in the chuck by the pressure of the chemical spray. The chuck can be affixed to a spindle with a hollow central passageway to allow for dispensing a chemical spray against the back or bottom side of the wafer while chemicals are simultaneously sprayed against the upper surface of the wafer. The entire wafer chuck spins by means of a motorized spindle, allowing even coverage of chemicals on the top and bottom of the substrate. A wafer release system is also provided to allow the wafer to be released from the chuck whenever desired.

Although this disclosure has been described in terms of certain preferred embodiments, other embodiments that are apparent to those of ordinary skill in the art, including embodiments that do not provide all of the features and advantages set forth herein, are also within the scope of this disclosure. Accordingly, the scope of the present disclosure is defined only by reference to the appended claims and equivalents thereof.

What is claimed is:
1. A semiconductor wafer spinning chuck, comprising:
a rotatable base;
a plurality of arms, upstanding from the base;
a selectively releasable clamping mechanism, associated with the arms, having a first portion configured to mechanically clamp an edge of a first semiconductor wafer and hold the first wafer in a substantially horizon- tal orientation upon all of the arms, with a backside of the first wafer facing down; and a spray nozzle, extending through the base, oriented to direct a spray of fluid at the backside of the first wafer.

2. A wafer spinning chuck in accordance with claim 1, wherein the plurality of arms comprise at least three arms.

3. A wafer spinning chuck in accordance with claim 1, wherein chuck is configured to rotate at a speed of from about 400 rpm to about 1000 rpm.

4. A wafer spinning chuck in accordance with claim 1, wherein the selectively releasable clamping mechanism comprises:

a first shoulder, disposed at a distal end of each arm, configured to support an edge region of the first wafer; and a moveable clamp rod, associated with each arm, each clamp rod having a slot and being configured to move between a first position in which the slot is drawn toward the first shoulder and capable of pressing the edge region of the first wafer against the first shoulder, and a second position in which the slot is moved away from the first shoulder.

5. A wafer spinning chuck in accordance with claim 4, further comprising a vertically moveable hub, centrally disposed upon the base, a lower extremity of the clamp rods being pivotally connected to the hub, downward movement of the hub causing the clamp rods to move toward the first position, and upward movement of the hub causing the clamp rods to move toward the second position.

6. A wafer spinning chuck in accordance with claim 5, further comprising a biasing member, configured to bias the hub downward and the clamp rods toward the first position.

7. A wafer spinning chuck in accordance with claim 4, wherein the selectively releasable clamping mechanism further comprises:

a second shoulder, disposed at a mid portion of each arm, configured to support an edge region of a second wafer; and a second slot, disposed upon each clamp rod, movement of each clamp rod toward the first position causing the second slot to move toward the second shoulder and press the edge region of the second wafer against the second shoulder to mechanically clamp and hold the second wafer in a substantially horizontal orientation upon all of the arms with a backside of the second wafer facing down, and movement of each clamp rod toward the second position causing the second slot to move away from the second shoulder.

8. A wafer spinning chuck in accordance with claim 7, wherein the arms have a radially diverging orientation, and wherein the first shoulders and first slots are configured to support the first wafer having a first larger diameter, and the second shoulders and the second slots are configured to support the second wafer having a second smaller diameter.

9. A wafer spinning chuck in accordance with claim 8, wherein the first larger diameter is 8 inches, and the second smaller diameter is 6 inches.

10. A wafer spinning chuck in accordance with claim 1 wherein the spray nozzle is centrally disposed in the base, and extends through a motorized spindle.

11. A semiconductor wafer spinning chuck, comprising:

a rotatable base;

a plurality of supports, upstanding from the base, configured to support an edge of a semiconductor wafer at a first common elevation above the base with the wafer substantially horizontal and a backside of the wafer substantially completely exposed;

a mechanical clamping mechanism, configured to selectively secure the semiconductor wafer upon the plurality of supports; and a backside spray mechanism, associated with the base, configured to provide a chemical spray against the exposed backside of the wafer while the base is spinning the wafer at a selected rotational speed.

12. A wafer spinning chuck in accordance with claim 11, wherein the plurality of supports comprise a plurality of arms, radially extending from the base, the arms having support surfaces disposed at the first common elevation.

13. A wafer spinning chuck in accordance with claim 12, wherein the arms further include support surfaces at a second common elevation, the supports at the first common elevation being configured to support a wafer of a first larger diameter, and the supports at the second common elevation being configured to support a wafer of a second smaller diameter.

14. A wafer spinning chuck in accordance with claim 11, wherein the clamping mechanism comprises:

a plurality of simultaneously moveable clamp rods, each disposed within one of the plurality of supports, each clamp rod having a first slot approximately at the first common elevation, the plurality of clamp rods being configured to move between a first position in which the first slots are drawn toward engagement with an edge of the wafer to secure the wafer to the chuck, and a second position in which the first slots are moved away from the edge of the wafer.

15. A wafer spinning chuck in accordance with claim 14, wherein the plurality of clamp rods further comprise a second slot, disposed at a second common elevation above the base, movement of the plurality of clamp rods between the first and second positions allowing selective engagement of the clamping mechanism with an edge of a wafer at the second common elevation.

* * * * *